United States Patent
Panja et al.

(10) Patent No.: US 11,867,572 B2
(45) Date of Patent: Jan. 9, 2024

(54) METHOD FOR IMPLEMENTING VPTAT MULTIPLIER IN HIGH ACCURACY THERMAL SENSOR

(71) Applicant: STMicroelectronics International N.V., Geneva (CH)

(72) Inventors: Pijush Kanti Panja, Singur (IN); Kallol Chatterjee, Kolkata (IN); Atul Dwivedi, Benares (IN)

(73) Assignee: STMicroelectron nternational N.V., Geneva (CH)

( * ) Notice: Subject to any disclaimer, the term of this patent is extended or adjusted under 35 U.S.C. 154(b) by 214 days.

(21) Appl. No.: 17/521,123

(22) Filed: Nov. 8, 2021

(65) Prior Publication Data
US 2022/0196485 A1    Jun. 23, 2022

Related U.S. Application Data

(60) Provisional application No. 63/129,244, filed on Dec. 22, 2020.

(51) Int. Cl.
| | |
|---|---|
| *H03K 17/14* | (2006.01) |
| *G01K 7/14* | (2006.01) |
| *G01K 7/01* | (2006.01) |
| *H03K 19/018* | (2006.01) |
| *H03M 1/12* | (2006.01) |

(52) U.S. Cl.
CPC .............. *G01K 7/14* (2013.01); *G01K 7/01* (2013.01); *H03K 17/14* (2013.01); *H03K 19/018* (2013.01); *H03M 1/1245* (2013.01)

(58) Field of Classification Search
CPC .... H03K 17/14; H03K 17/145; H03K 19/018; H03K 19/00369; H03K 2217/96035; H03M 1/124; H03M 1/1245; G01K 7/01; G01K 7/14
See application file for complete search history.

(56) References Cited

U.S. PATENT DOCUMENTS

| | | | | |
|---|---|---|---|---|
| 11,644,367 B2* | 5/2023 | Michel | ............... | H03M 1/066 374/178 |
| 2021/0239540 A1* | 8/2021 | Dwivedi | ............... | G05F 3/30 |

* cited by examiner

*Primary Examiner* — Long Nguyen
(74) *Attorney, Agent, or Firm* — Crowe & Dunlevy

(57) ABSTRACT

A temperature sensing circuit a switched capacitor circuit selectively samples ΔVbe and Vbe voltages and provides the sampled voltages to inputs of an integrator. A quantization circuit quantizes outputs of the integrator to produce a bitstream. When a most recent bit of the bitstream is a logic zero, operation includes sampling and integration of ΔVbe a first given number of times to produce a voltage proportional to absolute temperature. When the most recent bit of the bitstream is a logic one, operation includes cause sampling and integration of Vbe a second given number of times to produce a voltage complementary to absolute temperature. A low pass filter and decimator filters and decimates the bitstream produced by the quantization circuit to produce a signal indicative of a temperature of a chip into which the temperature sensing circuit is placed.

21 Claims, 12 Drawing Sheets

Φ1 = sampling phase
Φ2 = integration phase
Φ3 = selection phase for ΔVbe, which is Vbe1-Vbe2
Φ4 = selection phase for 0-Vbe Φ1 = sampling phase
Φ2 = integration phase
Φ3 = selection phase for ΔVbe, which is Vbe1-Vbe2
Φ4 = selection phase for 0-Vbe

METHOD FOR IMPLEMENTING VPTAT MULTIPLIER IN HIGH ACCURACY THERMAL SENSOR

RELATED APPLICATION

This application claims priority to United States Provisional Patent Application No. 63/129,244, filed Dec. 22, 2020, the contents of which are incorporated by reference in their entirety to the maximum extent allowable under the law.

TECHNICAL FIELD

This application is directed to the field of temperature sensing circuits and, in particular, to a temperature sensing circuit utilizing a sigma-delta based analog to digital converter to produce a highly accurate temperature value from which the temperature of the integrated circuit chip into which the temperature sensing circuit is placed can be determined. The sigma-delta based analog to digital converter scales input voltages in the time domain, thereby addressing issues of mismatch.

BACKGROUND

Systems on a chip (SOCs) are used in mobile devices such as smartphones and tablets, as well as in numerous embedded systems. Some current SOCs are capable of temperature-aware task scheduling, as well as self-calibration with respect to temperature to help reduce power consumption. In order to enable this functionality, such SOCs include on-chip temperature sensors integrated with other components of the SOCs.

A voltage proportional to absolute temperature Vptat can be produced as the difference between the base-emitter junction voltages of two bipolar junction transistors biased at different current densities. Mathematically, this can be represented as: Vptat=ΔVbe=Vbe1−Vbe2. This voltage proportional to absolute temperature Vptat is relatively error free in its generation because the errors in Vbe1 and Vbe2 due to lack of ideal performance of the transistors cancel each other out.

The relationship between Vptat and temperature can be mathematically represented as Vptat=kT/q ln (p), where T is the temperature in Kelvin, where k is the Boltzmann constant, q is the magnitude of the charge of an electron, and p is the ratio of the current densities of the bipolar junction transistors used to generate Vptat. An analog to digital converter (ADC) digitizes Vptat with respect to a temperature independent reference voltage Vref, and as a result, outputs a ratio μ that can be calculated as μ=Vptat/Vref. This ratio can be scaled appropriately to yield a digital temperature reading in a desired unit, for example:

Temperature (C°)=$A*\mu+B$, where $A$ and $B$ are constants.

To achieve the temperature independence of the reference voltage Vref, the reference voltage Vref is typically generated as the sum of the voltage proportional to absolute temperature Vptat and a voltage complementary to absolute temperature Vctat, as can be seen in FIG. 1.

The voltage complementary to absolute temperature Vctat is produced as the base-emitter junction voltage Vbe of a bipolar junction transistor.

A sample thermal sensor incorporating these principles is disclosed in U.S. patent application Ser. No. 17/136,240, filed Dec. 29, 2020 (which claims priority to Provisional Application for Patent No. 62/968,539 filed Jan. 31, 2020), entitled "CONTROLLED CURVATURE CORRECTION IN HIGH ACCURACY THERMAL SENSOR", the contents of which are incorporated by reference in their entirety.

This sample thermal sensor incorporates a switched capacitor sigma-delta modulated analog to digital converter (ADC) that samples an input voltage (Vptat, as described above) and converts it into a digital bitstream by employing a loop filter based on SC-Integrator blocks. The output of the loop filter is processed by a quantizer to produce a bitstream. This bitstream is used to apply appropriate feedback to complete a negative feedback loop. In particular, in the input sampling circuit of the sigma-delta modulated ADC, a reference voltage (Vref, as described above) is sampled and subtracted from the sampled input voltage Vptat depending on the bitstream generated previously. This complete loop encodes the bitstream in the time-domain in such way that an appropriate digital decimation filter can generate a digital code corresponding to a representation of the ratio described above of the input voltage Vptat to the reference voltage Vref from the bitstream.

In greater detail, the input sampling circuit of the sigma-delta modulated ADC is used to sample the input voltage Vptat from the base-emitter junction voltages of two bipolar junction transistors biased at different current densities, and generates the reference voltage Vref by sampling Vptat along with Vctat (a base-emitter junction voltage Vbe of a bipolar junction transistor).

In order to scale Vptat and Vctat, these voltages are sampled separately using a proper ratio of sampling capacitors. In particular, Vptat (keeping in mind that Vptat=ΔVbe=Vbe1−Vbe2) is sampled across a sampling capacitors as the voltage αΔVbe, while Vctat (keeping in mind that Vctat=Vbe) is sampled across a single sampling capacitor as the voltage Vbe. As explained, the detected temperature is generated based upon the ratio μ=Vptat/Vref, which, when substituting Vptat=αΔVbe, and Vref=Vptat+Vctat=αΔVbe+Vbe, is equal to αΔVbe/αΔVbe+Vbe. Therefore, it can be appreciated that an error in the α capacitors, for example due to mismatch in the capacitance values of different ones of the α capacitors, can result in an error in the ratio μ, which in turn results in error in the detected temperature.

To avoid this, dynamic element matching may be used on the sampling capacitors. However, dynamic element matching may be hardware and power intensive, for example involving digital logic circuits, level shifters, switches, bus routings, etc.

Therefore, further development into techniques for scaling the Vptat voltage in thermal sensors with a high degree of accuracy is required.

SUMMARY

A temperature sensor circuit generates a first base-emitter junction voltage (Vbe1) of a first bipolar junction transistor biased at a first current density (I), a second base-emitter junction voltage (Vbe2) of a second bipolar junction transistor having its base and collector coupled to those of the first bipolar junction transistor and being biased at a second current density (pI), and a third base-emitter junction voltage (Vbe) of a third bipolar junction transistor biased with a calibrated current and having non-linear curvature present over temperature.

A switched capacitor sigma-delta modulated (SDM) analog to digital converter (ADC) samples its input voltage and converts it into a digital bitstream (1s and 0s) by employing a loop filter based on switched capacitor integrator blocks. The order of the loop filter depends on the number of integrators used. The output of the loop filter is then processed by a quantizer to produce a bitstream. This bitstream is used to apply appropriate feedback to complete a negative feedback loop. In the input sampling circuit to the first integrator, a reference voltage is sampled and subtracted from the sampled input voltage, depending on the previously generated bit of the bitstream. This complete loop encodes the bitstream in the time-domain in such a way that an appropriate digital decimation filter can generate a digital code corresponding to an exact representation of ratio of input voltage to the reference voltage from the bitstream.

In the thermal sensor disclosed herein, the input sampling circuit of the SDM based ADC can be used to sample (and subsequently integrate) an input voltage, which is a voltage proportional to absolute temperature (Vptat), from Vbe1 and Vbe2. The input sampling circuit of the SDM can also generate a temperature independent reference voltage (Vref) by sampling (and subsequently integrating) Vptat and Vctat.

Exploiting the sigma-delta modulation principle, Vptat is sampled as the input voltage, which is subtracted by the bitstream dependent sampled reference voltage. Therefore, the sampling voltage can be Vptat or (Vptat-Vref) depending on whether the previously generated bit of bitstream was 0 or 1 respectively. This sampled voltage can be integrated and processed further in the loop filter and quantizer to generate the bitstream. The bitstream produced by the quantizer is used to suitably operate the switches of the switched capacitor circuits so as to achieve sampling and integration of Vptat and Vref in a fashion that yields a sigma-delta coded bitstream that, after filtering and decimation over a given window of time, represents a digital code that can be scaled appropriately to yield a digital temperature reading in a desired unit.

In one non-limiting example, when sampling Vptat, sampling and integration is performed $\alpha$ times while, when sampling Vref, sampling and integration is performed a single time, to thereby provide for scaling of Vptat by $\alpha$. In another non-limiting example, when sampling Vptat, sampling and integration is performed p times while, when sampling Vref, sampling and integration is performed q times, to thereby provide for scaling of Vptat by $\alpha=p/q$.

Therefore, as will be appreciated by those of skill in the art, disclosed herein is a technique for scaling Vptat in the time domain.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Do note that in the below description, any described resistor or resistance is a discrete device unless the contrary is stated, and is not simply an electrical lead between two points. Thus, any described resistor or resistance coupled between two points has a greater resistance than a lead between those two points would have, and such resistor or resistance cannot be interpreted to be a lead. Similarly, any described capacitor or capacitance is a discrete device unless the contrary is stated, and is not a parasitic. Moreover, any described inductor or inductance is a discrete device unless the contrary is stated, and is not a parasitic.

Figure 1:
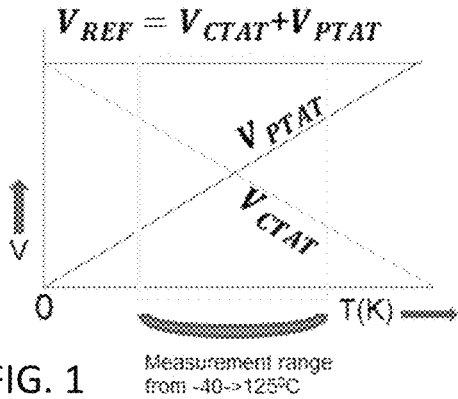
FIG. 1 is a graph showing generation of a temperature independent reference voltage (Vref) in a prior art temperature sensor by summing a voltage proportional to absolute temperature (Vptat) and a voltage complementary to absolute temperature (Vctat).
Figure 2:
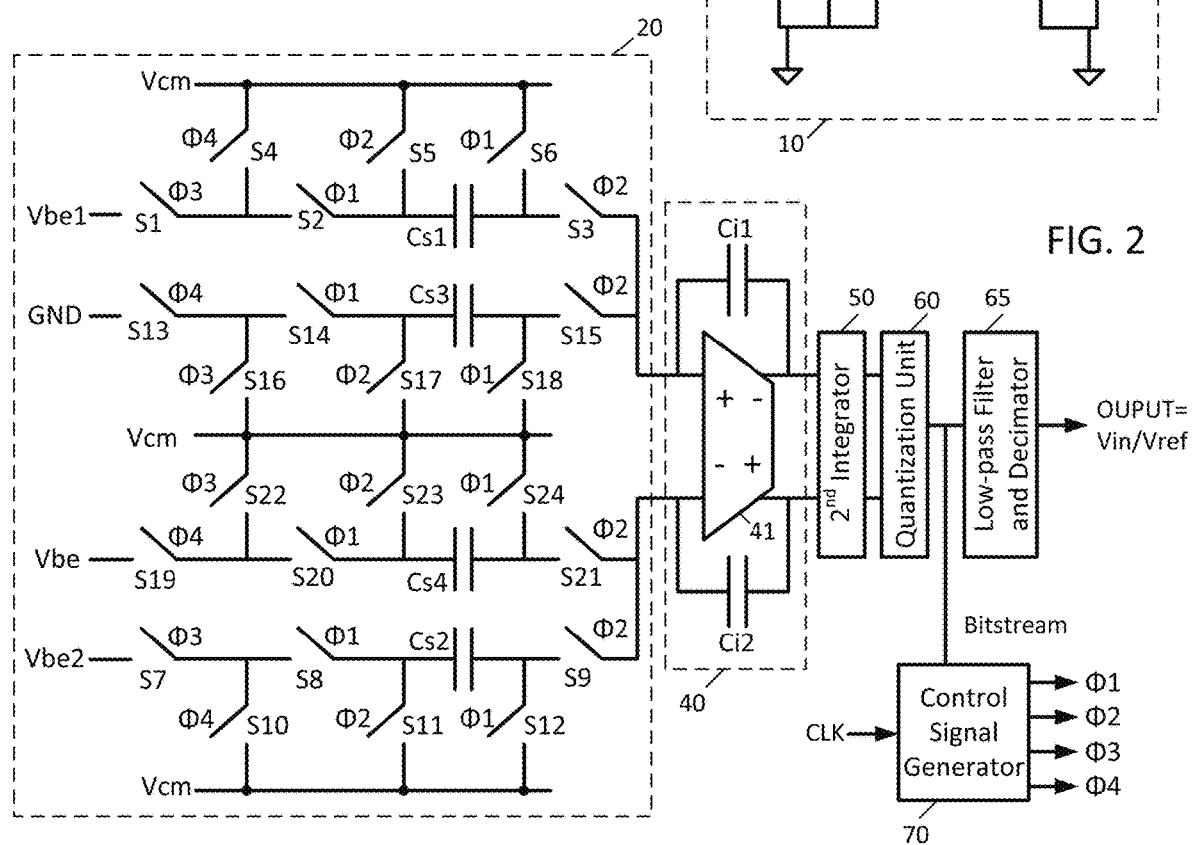
FIG. 2 is a detailed schematic diagram of an on-chip temperature sensor utilizing a sigma-delta analog to digital converter, in accordance with this disclosure.

The structure of a temperature sensor circuit 5 is now described in detail with reference to FIG. 2, and thereafter operation of the temperature sensor circuit 5 will be described with reference to FIG. 3 and FIGS. 4A-4D.

A. Structure of Temperature Sensor Circuit

The temperature sensor circuit 5 is arranged to include a sigma-delta modulated analog to digital converter (ADC). The temperature sensor circuit 5 includes an analog voltage generation circuit 10, a switched capacitor input sampling circuit 20 which has inputs receiving the voltages generated by the analog voltage generation circuit 10 and differential signal outputs coupled to non-inverting and inverting terminals of a first integrator 40. The first integrator 40 has differential signal outputs coupled to differential signal inputs of a second integrator 50, which in turn has differential signal outputs coupled to differential signal inputs of a quantization circuit 60. The quantization circuit 60 produces a Bitstream that is fed to a control signal generator 70 and a low-pass filtering and decimation circuit 65. The control signal generator 70 generates control signals $\phi 1$, $\phi 2$, $\phi 3$, and 04 in response to the logic state of bits of the Bitstream, where the control signals control switching actuation of the various switches of the switched capacitor input sampling circuit 20. The low-pass filtering and decimation circuit 65 produces an output code from the Bitstream which can be used to calculate the temperature of the integrated circuit chip into which the temperature sensor circuit 5 is integrated, in a desired unit.

In detail, the analog voltage generation circuit 10 includes bipolar junction PNP transistors QP1 and QP2 having their collectors and bases connected to ground. The emitter of QP2 is connected to a current source 11 to receive the current I, and the emitter of QP1 is connected to a current source 12 to receive the current pI (meaning that the magnitude of the current pI is equal to the magnitude of the current I, scaled by a factor p). Voltage Vbe1, the voltage of the base-emitter junction of transistor QP1, is produced at the emitter of transistor QP1. Likewise, voltage Vbe2, the voltage of the base-emitter junction of transistor QP2, is produced at the emitter of transistor QP2.

The analog voltage generation circuit 10 also includes PNP transistor QP3 having its collector and base connected to ground, and its emitter connected to a current source 13 to receive a calibrated current Ical. Voltage Vbe, the voltage of the base-emitter junction of transistor QP3, is produced at the emitter of transistor QP3. The voltage Vbe is complementary to absolute temperature and can therefore be referred to as Vctat.

The switched capacitor input sampling circuit 20 includes a switch S1 (closed when control signal 13 is logic high, and open otherwise) to selectively connect voltage Vbe1 to a first node of the switch S2 (closed when control signal $\Phi 1$ is logic high, and open otherwise). A first node of a capacitor Cs1 is connected to a second node of the switch S2. A switch S3 (closed when control signal $\Phi 2$ is logic high, and open otherwise) selectively connects a second node of the capacitor Cs1 to the non-inverting terminal of the first integrator 41. A switch S4 (closed when control signal $\Phi 4$ is logic high, and open otherwise) selectively connects the first node of switch S2 to a common mode voltage Vcm. A switch S5 (closed when control signal $\Phi 2$ is logic high, and open otherwise) selectively connects the first node of the capacitor Cs1 to the common mode voltage Vcm, and a switch S6 (closed when control signal $\Phi 1$ is logic high, and open otherwise) selectively connects the second node of the capacitor Cs1 to the common mode voltage Vcm.

The switched capacitor input sampling circuit 20 further includes a switch S7 (closed when control signal $\Phi 3$ is high, and open otherwise) to selectively connect voltage Vbe2 to a first node of switch S8 (closed when control signal $\Phi 1$ is high, and open otherwise). A first node of a capacitor Cs2 is connected to a second node of the switch S8. A switch S9 (closed when control signal $\Phi 2$ is high, and open otherwise) selectively connects a second node of the capacitor Cs2 to the inverting terminal of the first integrator 41. A switch S10 (closed when control signal $\Phi 4$ is high, and open otherwise) selectively connects the first node of the switch S8 to the common mode voltage Vcm. A switch S11 (closed when control signal $\Phi 2$ is high, and open otherwise) selectively connects the first node of the capacitor Cs2 to the common mode voltage Vcm. A switch S12 (closed when the control signal $\Phi 1$ is high, and open otherwise) selectively connects the second node of the capacitor Cs2 to the common mode voltage Vcm.

The switched capacitor input sampling circuit 20 still further includes a switch S13 (closed when control signal $\Phi 4$ is logic high, and open otherwise) to selectively connect a ground voltage to a first node of switch S14 (closed when control signal $\Phi 1$ is logic high, and closed otherwise). A second node of switch S14 is connected to a first node of capacitor Cs3. Switch S15 (closed when control signal $\Phi 2$ is logic high, and open otherwise) selectively connects a second node of the capacitor Cs3 to the non-inverting input of the first integrator 41. A switch S16 (closed when control signal 13 is a logic high, and open otherwise) selectively connects the first node of the switch S14 to the common mode voltage Vcm. A switch S17 (closed when control signal $\Phi 2$ is logic high, and open otherwise) selectively connects the first node of the capacitor Cs3 to the common mode voltage Vcm, and a switch S18 (closed when control signal $\Phi 1$ is a logic high, and open otherwise) selectively connects the second node of the capacitor Cs3 to the common mode voltage Vcm.

Additionally, a switch S19 (closed when the control signal $\Phi 4$ is logic high, and open otherwise) selectively connects the voltage Vbe to a first node of the switch S20 (closed when the control signal $\Phi 1$ is a logic high, and open otherwise). A second node of the switch S20 is connected to a first node of a capacitor Cs4. A switch S21 (closed when the control signal $\Phi 2$ is a logic high, and open otherwise) selectively connects a second node of the capacitor Cs4 to the inverting terminal of the first integrator 41. A switch S22 (closed when the control signal $\Phi 3$ is a logic high, and open otherwise) selectively connects the first node of the switch S20 to the common mode voltage Vcm. A switch S23 (closed when the control signal $\Phi 2$ is a logic high, and open otherwise) selectively connects the first node of the capacitor Cs4 to the common mode voltage Vcm. A switch S24 (closed when the control signal $\Phi 1$ is a logic high, and open otherwise) selectively connects the second node of the capacitor Cs4 to the common mode voltage Vcm.

The capacitors Cs1, Cs2, Cs3, and Cs4 may be matched and have equal capacitance values.

The integrator 40 is comprised of a fully differential amplifier 41 having a first integration capacitor Ci1 connected between its non-inverting input and its non-inverting output, and a second integration capacitor Ci2 connected between its inverting input and its inverting output. A second integrator 50 has differential inputs coupled to the non-inverting and inverting outputs of the amplifier 41, and has differential outputs coupled to the differential inputs of the quantization circuit 60. The quantization circuit 60 has an output (providing the Bitstream) coupled to the low-pass filtering and decimation circuit 65, as well as to the control signal generator 70. As stated, the low-pass filtering and decimation circuit 65 provides an output code, and this output digital code is used to determine the temperature of the chip into which the temperature sensor circuit 5 is integrated. In addition, as also stated, the control signal generator 70 generates new control signal $\Phi 1$, $\Phi 2$, $\Phi 3$, $\Phi 4$ as a function of the most recently received bit of the bitstream.

B. Functional Operation of Temperature Sensor Circuit

First, the theory behind the operation of the temperature sensor circuit 5 is described.

The voltage equal to (Vbe1−Vbe2), generated by transistors QP1 and QP2 and the operation of the circuit 20 and first integrator 40, is proportional to absolute temperature and can be referred to as Vptat or ΔVbe. As will be explained below, ΔVbe can be scaled by a factor α in the time domain by repeatedly sampling and integrating ΔVbe, a times, to effectively produce the voltage αΔVbe. The voltage Vbe, generated by transistor QP3, is complementary to absolute temperature and can be referred to as Vctat.

By adding the voltage Vbe to the voltage ΔVbe, a temperature independent reference voltage Vref can be produced.

It is the goal of the temperature sensor circuit 5 to produce a digital code which, taken over a given window of time, represents α*ΔVbe sampled with respect to Vref, which, stated alternatively, is a ratio μ=α*ΔVbe/Vref that can be used in the equation Temperature=A*μ+B, with A and B being constants selected so that Temperature is expressed in a desired unit value, such as Celsius.

To accomplish this, when the most recently generated value of the Bitstream (produced by the quantization circuit 60) is a logical zero, it is desired for the sigma-delta modulated analog to digital converter to sample the voltage ΔVbe, a times, and when the most recently generated value of Bitstream is a logical one, it is desired for the sigma-delta modulated analog to digital converter to sample the voltage ΔVbe-Vref, one time. Note that, mathematically, Vref=ΔVbe+Vbe, and therefore, sampling -Vbe is equivalent to sampling ΔVbe-Vref.

Now, operation of the temperature sensor circuit will be described in detail with reference to FIGS. 4A-4D, as well as the timing diagram of FIG. 3. At the receipt of each pulse of the clock signal CLK, the control signal generator 70 generates new values for the control signals Φ1, Φ2, Φ3, and Φ4 based upon the logic value of the most recently received bit of the Bitstream generated by the quantization circuit 60. The control signals Φ1, Φ2, Φ3, and Φ4 are generated so as to effectuate a sampling phase when the clock signal CLK is logic high, and an integration phase when the clock signal CLK is logic low.

Figure 3:
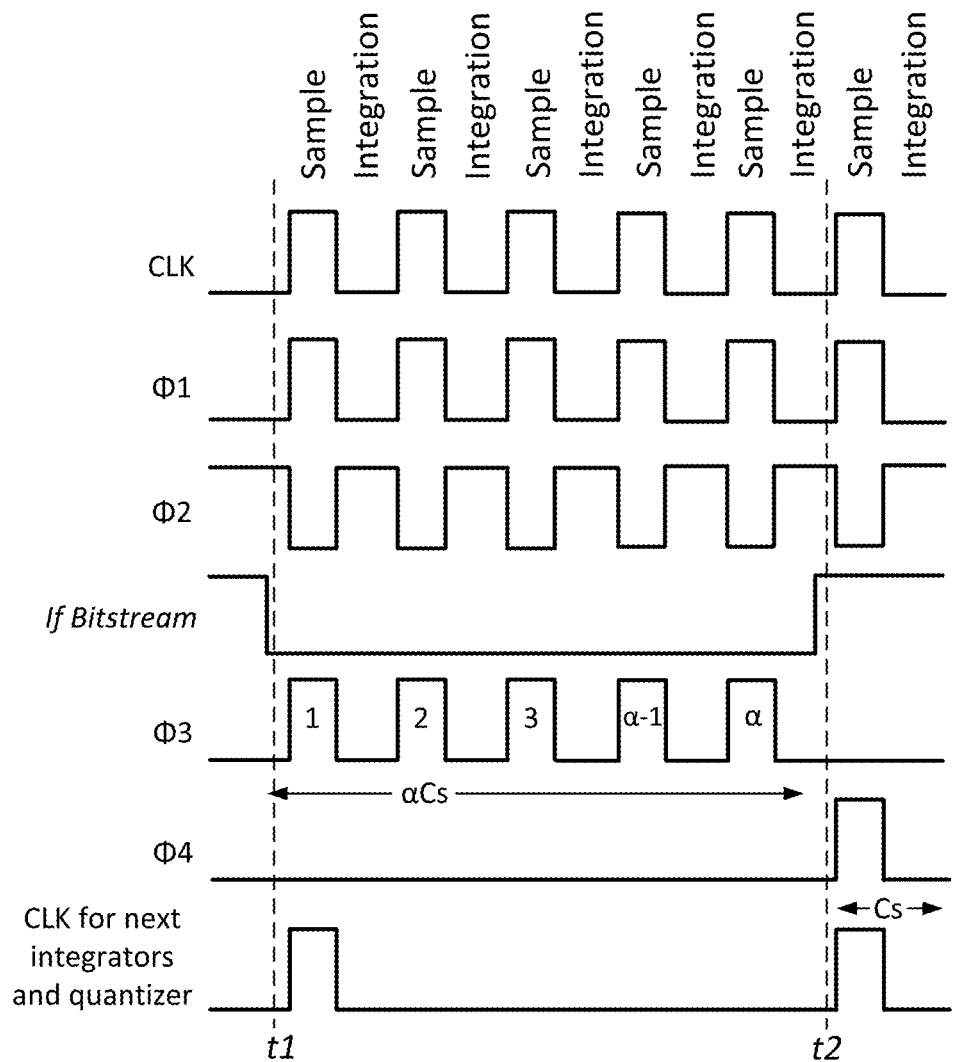
FIG. 3 is a timing diagram showing timing control signals for the switches of the on-chip temperature sensor of FIG. 2 during sampling and integration phases, dependent on the previously output bit of the generated bitstream, to produce operating states shown in FIGS. 4A-4D.
Figure 4A:
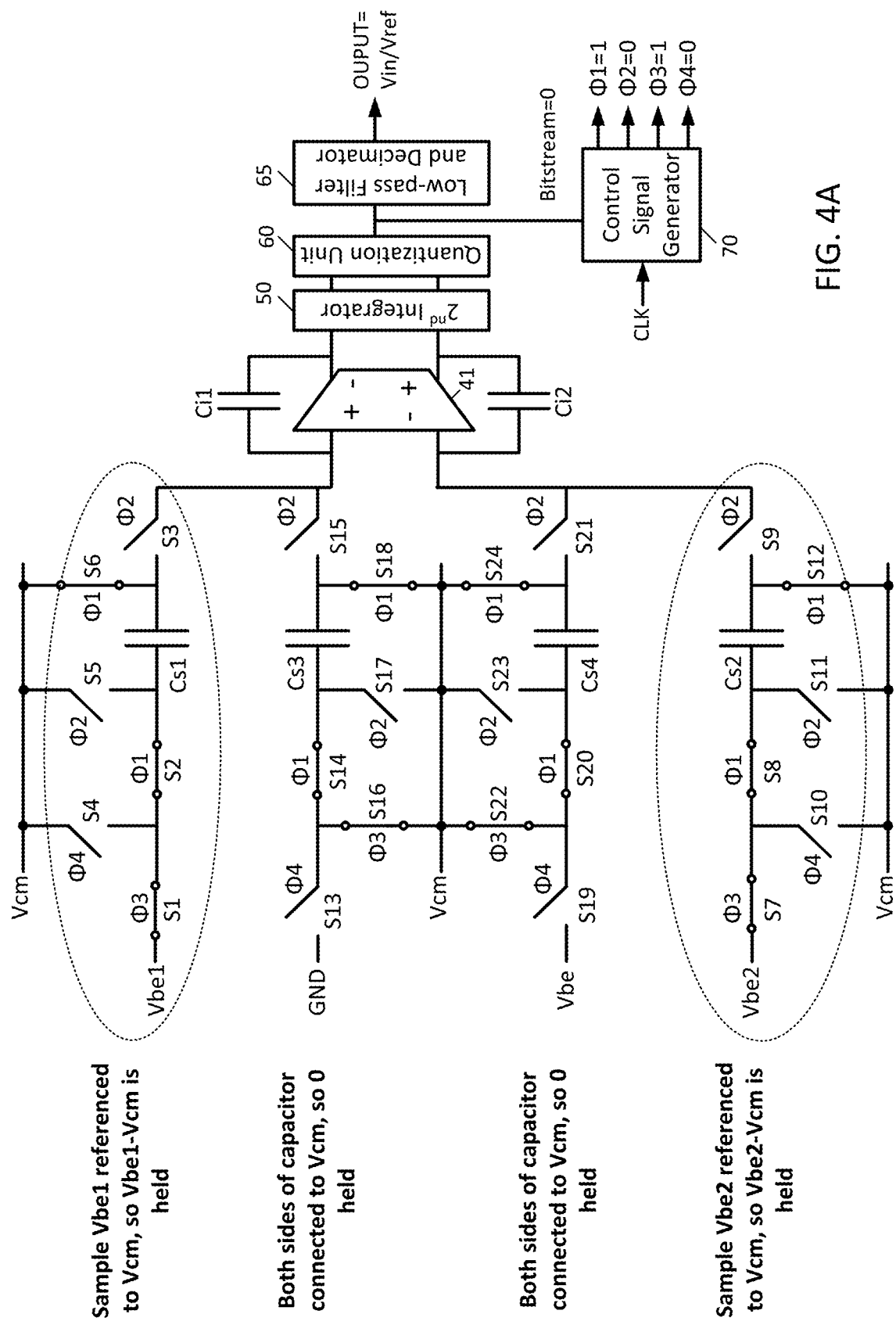
FIG. 4A shows the design of FIG. 2 operating in a sampling phase when the previously output bit of the generated bitstream was a logic 0.

Shown in FIG. 4A is the case where the most recently generated bit of the Bitstream received by the control signal generator 70 is a logic one. In such a case, as shown in FIG. 3, when the clock signal CLK transitions to a logic high at time t1 and the Bitstream is at a logic one, the control signal generator 70 causes the control signals Φ1 and Φ3 to transition to a logic high and stay logic high until the clock signal CLK transitions to logic low, while maintaining control signals Φ2 and Φ4 logic low, thereby beginning a sampling phase.

This sampling phase is shown in FIG. 4A, where it can be seen that: switches S1, S2, and S6 close to sample the voltage Vbe1 referenced to the common mode voltage Vcm across the capacitor Cs1, thereby charging the capacitor Cs1 to Vbe1-Vcm; and switches S7, S8, and S12 close to sample the voltage Vbe2 referenced to the common mode voltage Vcm across the capacitor Cs2, thereby charging the capacitor Cs2 to Vbe2-Vcm. In addition, so as to maintain the capacitive loading on the first integrator 40 as uniform across sampling and integration phases: switches S14, S16, and S18 close to sample the common mode voltage Vcm referenced to itself across the capacitor Cs3, thereby maintaining the capacitor Cs3 at 0V; and switches S20, S22, and S24 close to sample the common mode voltage Vcm referenced to itself across the capacitor Cs4, thereby maintaining the capacitor Cs4 at 0V.

Figure 4B:
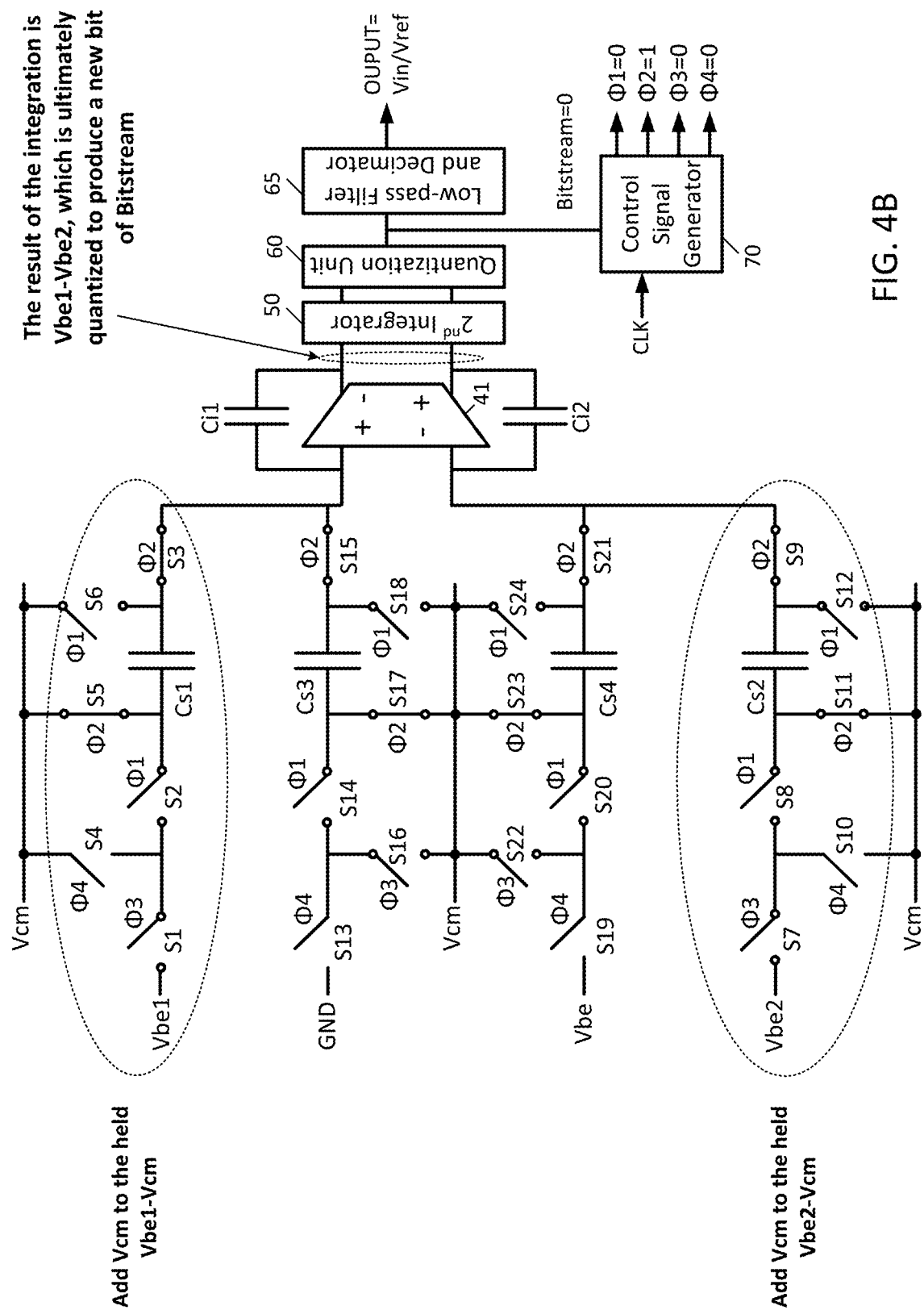
FIG. 4B shows the design of FIG. 2 operating in an integration phase when the previously output bit of the generated bitstream was a logic 0.

When the clock signal CLK then transitions to logic low, as shown in FIG. 3, the control signal generator 70 then causes the control signals Φ1 and Φ3 to transition to logic low, causes the control signal Φ2 to transition to a logic high, and maintains the control signal Φ4 logic low, thereby beginning an integration phase. This integration phase is shown in FIG. 4B, where it can be seen that: switches S3 and S5 close to add the voltage Vcm to the voltage Vbe1-Vcm stored across the capacitor Cs1, such that the voltage Vbe1 is applied to the non-inverting terminal of the integrator 41; and switches S9 and S11 close to add the voltage Vcm to the voltage Vbe2-Vcm stored across the capacitor Cs2, such that the voltage Vbe2 is applied to the inverting terminal of the integrator 41.

In addition, so as to maintain the capacitive loading on the integrator 41 as uniform across sampling and integration phases: switches S15 and S17 close to add Vcm to the 0V stored across the capacitor Cs3, thereby applying Vcm to the non-inverting terminal of the integrator 41; and switches S21 and S23 close to add Vcm to the 0V stored across the capacitor Cs4, thereby applying Vcm to the inverting terminal of the integrator 41.

Summing the voltages applied to the non-inverting terminal of the integrator 41 yields the voltage Vbe1+Vcm, while summing the voltages applied to the inverting terminal of the integrator 40 yields the voltage Vbe2+Vcm. The result of the integration performed by the integrator 40 is therefore the voltage Vbe1-Vbe2, assuming the integrator 40 has a unity gain.

Note that, as shown in FIG. 3, the sampling phase (FIG. 4A) and integration phase (FIG. 4B) are each repeated a times when Bitstream is at 0. Therefore, α(Vbe1-Vbe2) is ultimately integrated when the Bitstream is at 0, and the second integrator 50 performs a further integration of the voltage α(Vbe1-Vbe2), which is then quantized to generate a next bit of the Bitstream by the quantization circuit 60. This next bit of the Bitstream will be used by the control signal generator 70 to generate new values of control signals Φ1, Φ2, Φ3, and Φ4. In addition, the Bitstream is passed through circuit 65, which performs a low pass filtering and decimation to yield the output digital code (in which the ratio of 1s to 0s over a given window of time represents the desired output μ, which can be used to calculate the temperature of the chip into which the temperature sensor circuit 5 is integrated).

Figure 4C:
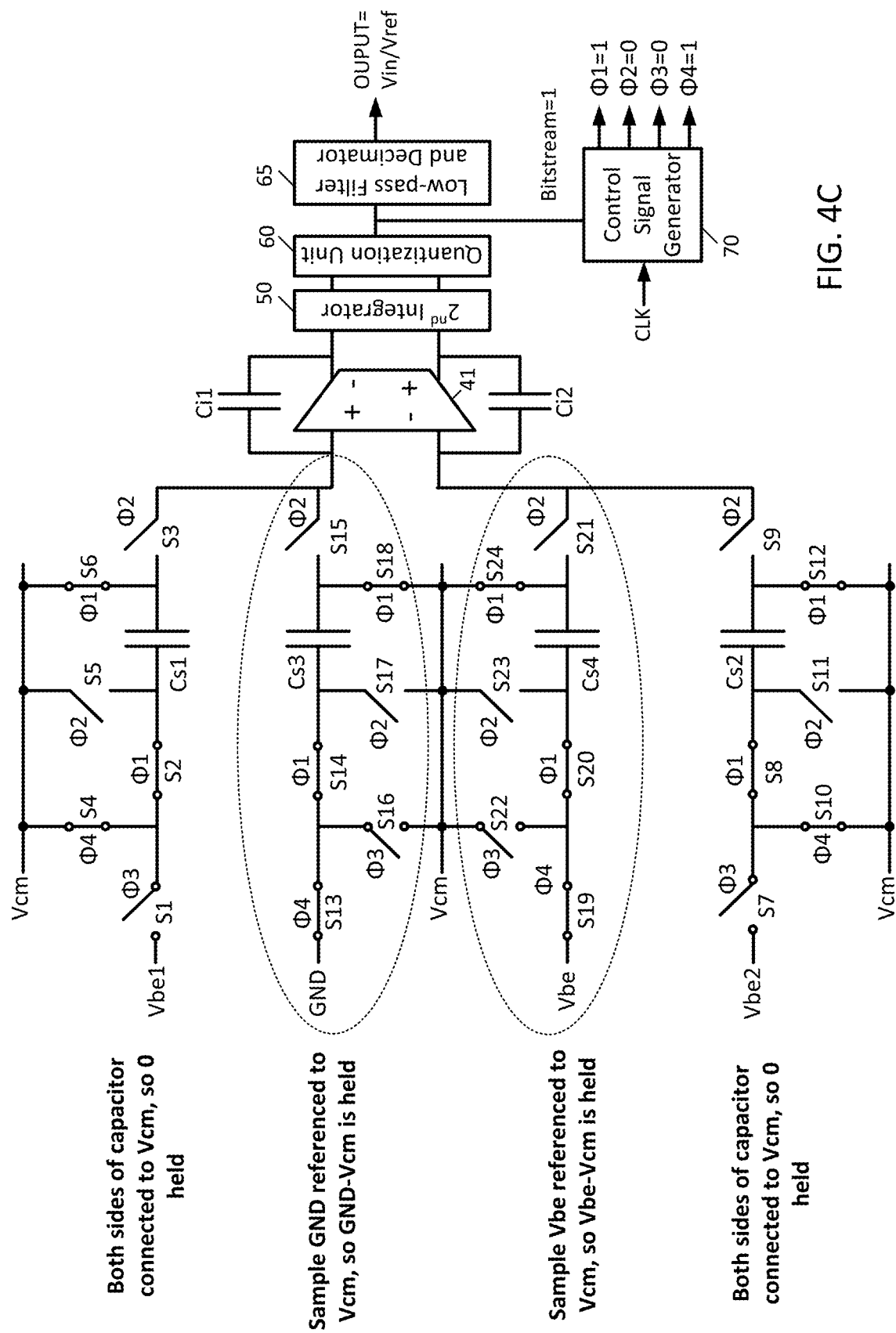
FIG. 4C shows the design of FIG. 2 operating in a sampling phase when the previously output bit of the generated bitstream was a logic 1.

Assume now that the next bit produced by the quantization circuit 60, at time t2, is a logical 1. In such a case, as shown in FIG. 3, when the clock signal CLK transitions to logic high and the Bitstream is at a logic zero, the control signal generator 70 causes the control signals Φ1 and Φ4 to transition to logic high and stay logic high until the clock signal CLK transitions to a logic low, while maintaining the control signals Φ2 and Φ3 logic low, thereby beginning a sampling phase. This sampling phase is shown in FIG. 4C, where it can be seen that: switches S13, S14, and S18 close to sample ground referenced to the common mode voltage Vcm across the capacitor Cs3, thereby charging the capacitor Cs3 to the voltage GND-Vcm; and switches S19, S20, and S21 close to sample the voltage Vbe referenced to the common mode voltage Vcm across the capacitor Cs4, thereby charging the capacitor Cs4 to the voltage Vbe-Vcm.

In addition, so as to maintain the capacitive loading on the first integrator 40 as uniform across sampling and integration phases: switches S2, S4, and S6 close to connect both sides of the capacitor Cs1 to the common mode voltage Vcm, thereby maintaining the capacitor Cs1 at 0V; and switches S8, S10, and S12 close to connect both sides of the capacitor Cs2 to the common mode voltage Vcm, thereby maintaining the capacitor Cs2 at 0V.

When the clock signal CLK then transitions to a logic low, as shown in FIG. 4, the control signal generator 70 then causes the control signals Φ1 and Φ4 to transition to a logic low, causes the control signal Φ2 to transition to logic high, and maintains the control signal Φ3 logic low, thereby beginning an integration phase. This integration phase is shown in FIG. 4D, where it can be seen that: switches S2 and S15 close to add the voltage Vcm to the voltage GND-Vcm stored across the capacitor Cs3, thereby applying GND to the non-inverting terminal of the integrator 41; and switches S23 and S21 close to add the voltage Vcm to the voltage Vbe-Vcm stored across the capacitor Cs4, thereby applying Vbe to the inverting terminal of the integrator 41.

In addition, so as to maintain the capacitive loading on the integrator 41 as uniform across sampling and integration phases: switches S2 and S5 close to add Vcm to the 0V stored across the capacitor Cs1, thereby applying the voltage Vcm to the non-inverting terminal of the integrator 41; and switches S9 and S11 close to add Vcm to the 0V stored across the capacitor Cs2, thereby applying the voltage Vcm to the inverting terminal of the integrator 41.

Summing the voltages applied to the non-inverting terminal of the integrator 41 yields the voltage GND, while summing the voltages applied to the inverting terminal of the integrator 41 yields the voltage Vbe. The result of the integration performed by the integrator 41 is therefore the voltage −Vbe, assuming the integrator 41 has a unity gain.

Figure 4D:
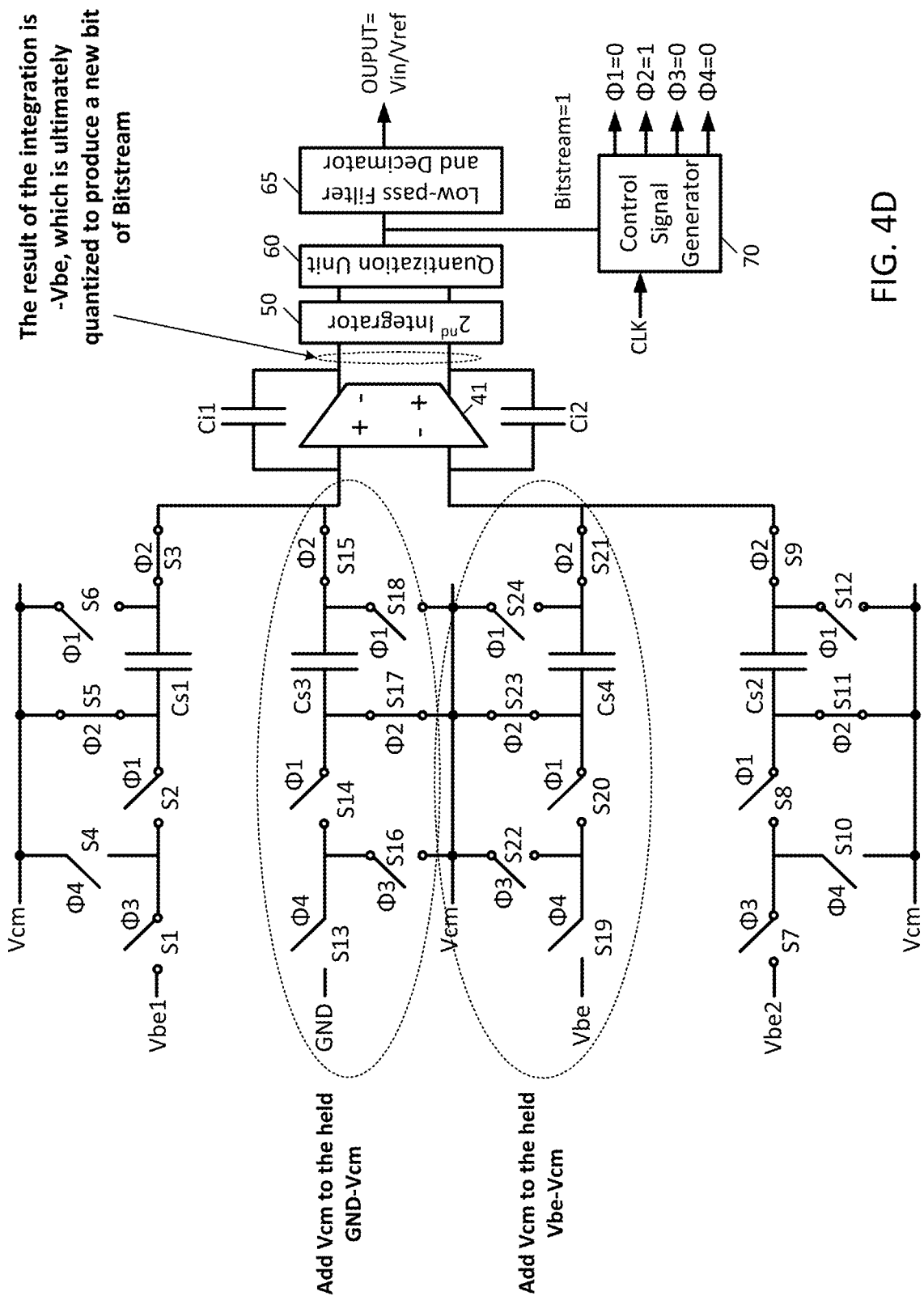
FIG. 4D shows the design of FIG. 2 operating in an integration phase when the previously output bit of the generated bitstream was a logic 1.
Figure 5:
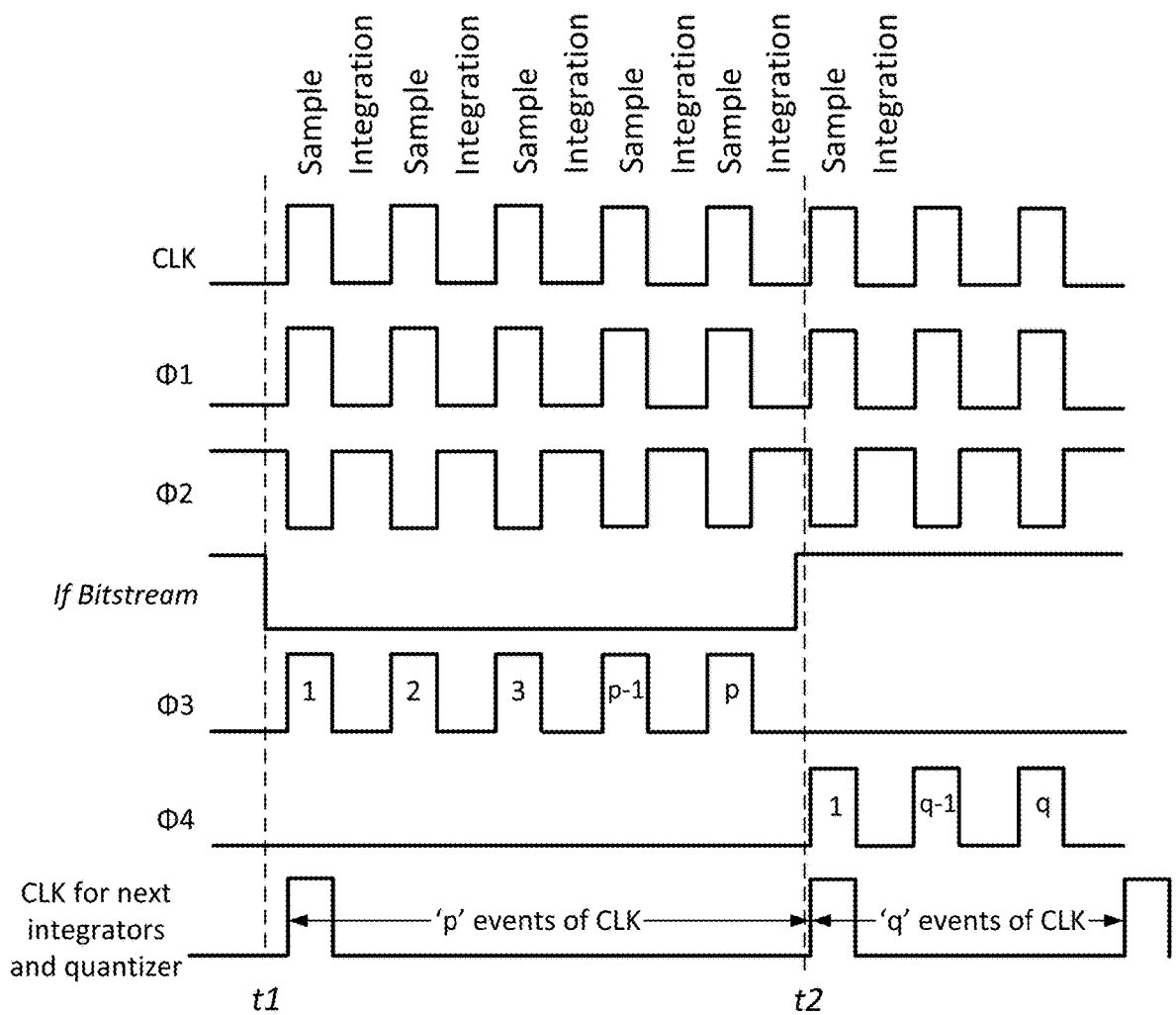
FIG. 5 is a timing diagram showing an alternative of timing control signals for the switches of the on-chip temperature sensor of FIG. 2 during sampling and integration phases, dependent on the previously output bit of the generated bitstream, to produce operating states shown in FIGS. 4A-4D.

As stated above, when the Bitstream is 0, it is desired to sample the voltage −Vbe, which as shown immediately above, is the result of the integration performed by the integrator 41 in FIG. 4D.

Therefore, it can be seen that when the Bitstream is 0, the integrator 41 integrates the voltage −Vbe, as desired. Note that, as shown in FIG. 3, the sampling phase (FIG. 4C) and integration phase (FIG. 4D) are performed once when Bitstream is at 0, and therefore −Vbe is ultimately integrated when the Bitstream is at 0, and the second integrator 50 performs a further integration of the voltage −Vbe, which is then quantized to generate a next bit of the Bitstream by the quantization circuit 60. This next bit of the Bitstream will be used by the control signal generator 70 to generate new values of the control signals Φ1, Φ2, Φ3, and Φ4. In addition, the Bitstream is passed through the low-pass filtering and decimation circuit 65, which performs a low pass filtering and decimation to yield the output digital code (in which the ratio of 1s to 0s over a given window of time represents the desired output μ, which can be used to calculate the temperature of the chip into which the temperature sensor circuit 5 is integrated).

This design of the temperature sensor 5 therefore not only eliminates the need to use of digital element matching hardware, but also accomplishes scaling of ΔVbe with the use of single capacitors as opposed to using multiple banks of capacitors. Stated another way, scaling of ΔVbe by α is accomplished in the time domain, as opposed to being accomplished in hardware by using α capacitors for sampling Vbe1 and Vbe2. This eliminates mismatch errors, since there is but a single capacitor for Vbe1 and for Vbe2. Still further, this also provides the benefit of a reduction in the routing, that reduces not only space consumed but also parasitic capacitances.

C. Alternative Configurations

In the above description, the sampling and integration has been described as being performed α times when Bitstream is 0 and but one time when Bitstream is 1 to provide for integration of α(Vbe1−Vbe2). However, as an alternative, the sampling and integration may be performed p times when Bitstream is 0 and q times when Bitstream is 1, to therefore provide for integration of α(Vbe1−Vbe2), where α=p/q, as shown in the timing diagram of FIG. 6. Note that p and q are integers, and thereby permit for fractional scaling of ΔVbe. In some instances, p may be greater than q.

Given the above description of the operation of the temperature sensor circuit 5, it should be apparent that, during operation, there is but one voltage applied to the non-inverting terminal of the integrator 41 and to the inverting terminal of the integrator 41 at a time. Therefore, the design of the switched capacitor input sampling circuit 20' may be simplified, as shown in the temperature sensor circuit 5' of FIG. 6.

Here, the switched capacitor input sampling circuit 20' includes a switch S30 (closed when control signal Φ4 is logic high, and open otherwise) to selectively connect ground to a first node of switch S31 (closed when control signal Φ1 is logic high, and closed otherwise). A second node of switch S31 is connected to a first node of capacitor Cs5. Switch S32 (closed when control signal Φ2 is logic high, and open otherwise) selectively connects a second node of the capacitor Cs5 to the non-inverting input of the first integrator 40. A switch S33 (closed when control signal 13 is a logic high, and open otherwise) selectively connects the first node of the switch S31 to Vbe. A switch S34 (closed when control signal Φ2 is logic high, and open otherwise) selectively connects the first node of the capacitor Cs5 to the common mode voltage Vcm, and a switch S35 (closed when control signal Φ1 is a logic high, and open otherwise) selectively connects the second node of the capacitor Cs5 to the common mode voltage Vcm.

A switch S36 (closed when the control signal Φ4 is logic high, and open otherwise) selectively connects the voltage Vbe to a first node of the switch S37 (closed when the control signal Φ1 is a logic high, and open otherwise). A second node of the switch S37 is connected to a first node of a capacitor Cs6. A switch S38 (closed when the control signal Φ2 is a logic high, and open otherwise) selectively connects a second node of the capacitor Cs6 to the inverting terminal of the first integrator 40. A switch S39 (closed when the control signal 13 is a logic high, and open otherwise) selectively connects the first node of the switch S37 to Vbe2. A switch S29 (closed when the control signal Φ2 is a logic high, and open otherwise) selectively connects the first node of the capacitor Cs6 to the common mode voltage Vcm. A switch S28 (closed when the control signal Φ1 is a logic high, and open otherwise) selectively connects the second node of the capacitor Cs6 to the common mode voltage Vcm.

The capacitors Cs5 and Cs6 may be matched and have equal capacitance values.

Figure 6:
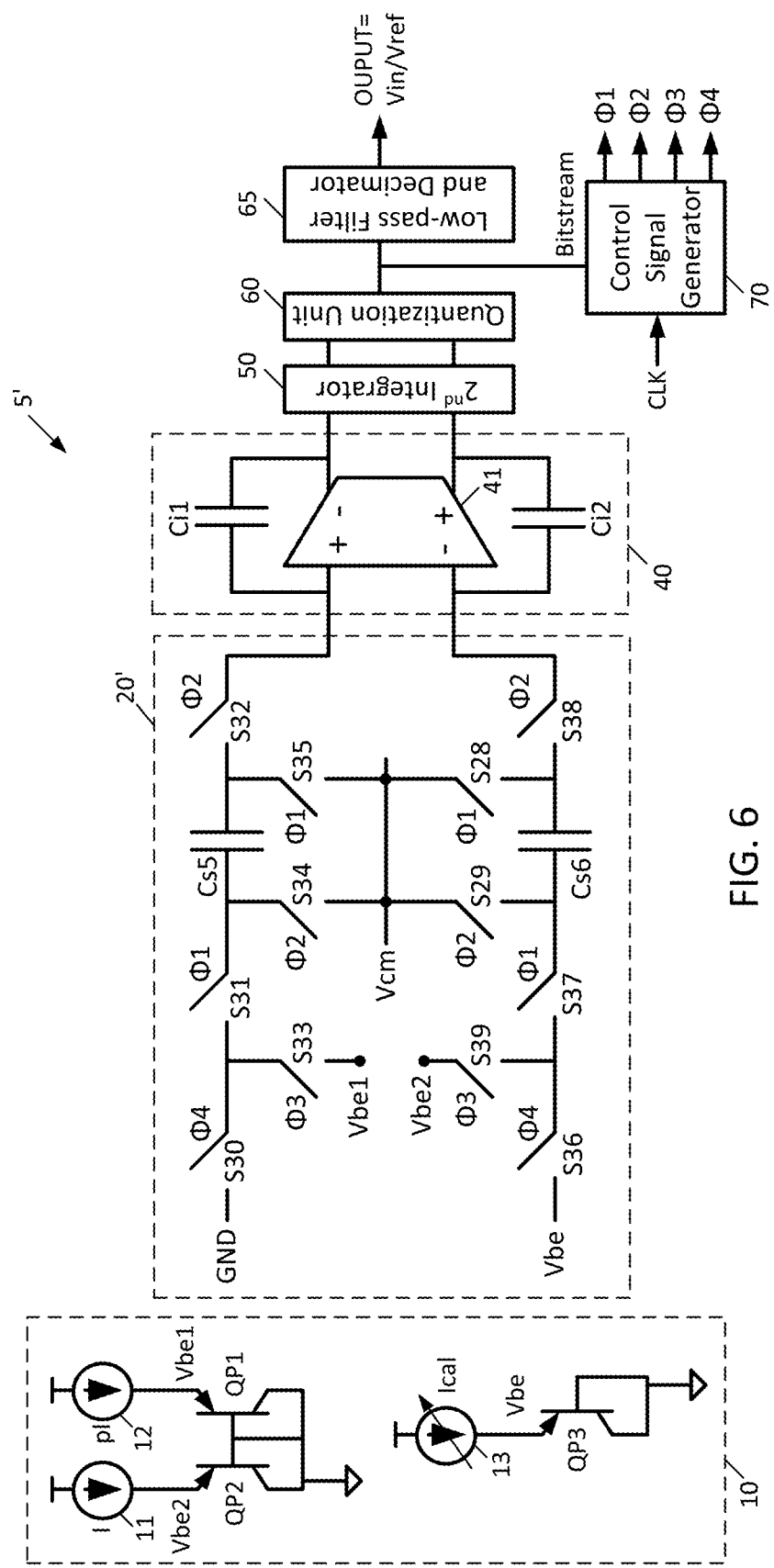
FIG. 6 is a detailed schematic diagram of another design for an on-chip temperature sensor utilizing a sigma-delta analog to digital converter, in accordance with this disclosure.

Operation of the temperature sensor circuit 5' of FIG. 6 is now described with reference to FIGS. 7A-7D.

At the receipt of each pulse of the clock signal CLK, the control signal generator 70 generates new values for the control signals Φ1, Φ2, Φ3, and Φ4 based upon the logic value of the most recently received bit of the Bitstream generated by the quantization circuit 60. The control signals Φ1, Φ2, Φ3, and Φ4 are generated so as to effectuate a sampling phase when the clock signal CLK is logic high, and an integration phase when the clock signal CLK is logic low.

Where the most recently generated bit of the Bitstream received by the control signal generator 70 is a logic one, when the clock signal CLK transitions to a logic high at time t1, the control signal generator 70 causes the control signals Φ1 and Φ3 to transition to a logic high and stay logic high until the clock signal CLK transitions to logic low, while maintaining control signals Φ2 and Φ4 logic low, thereby beginning a sampling phase.

Figure 7A:
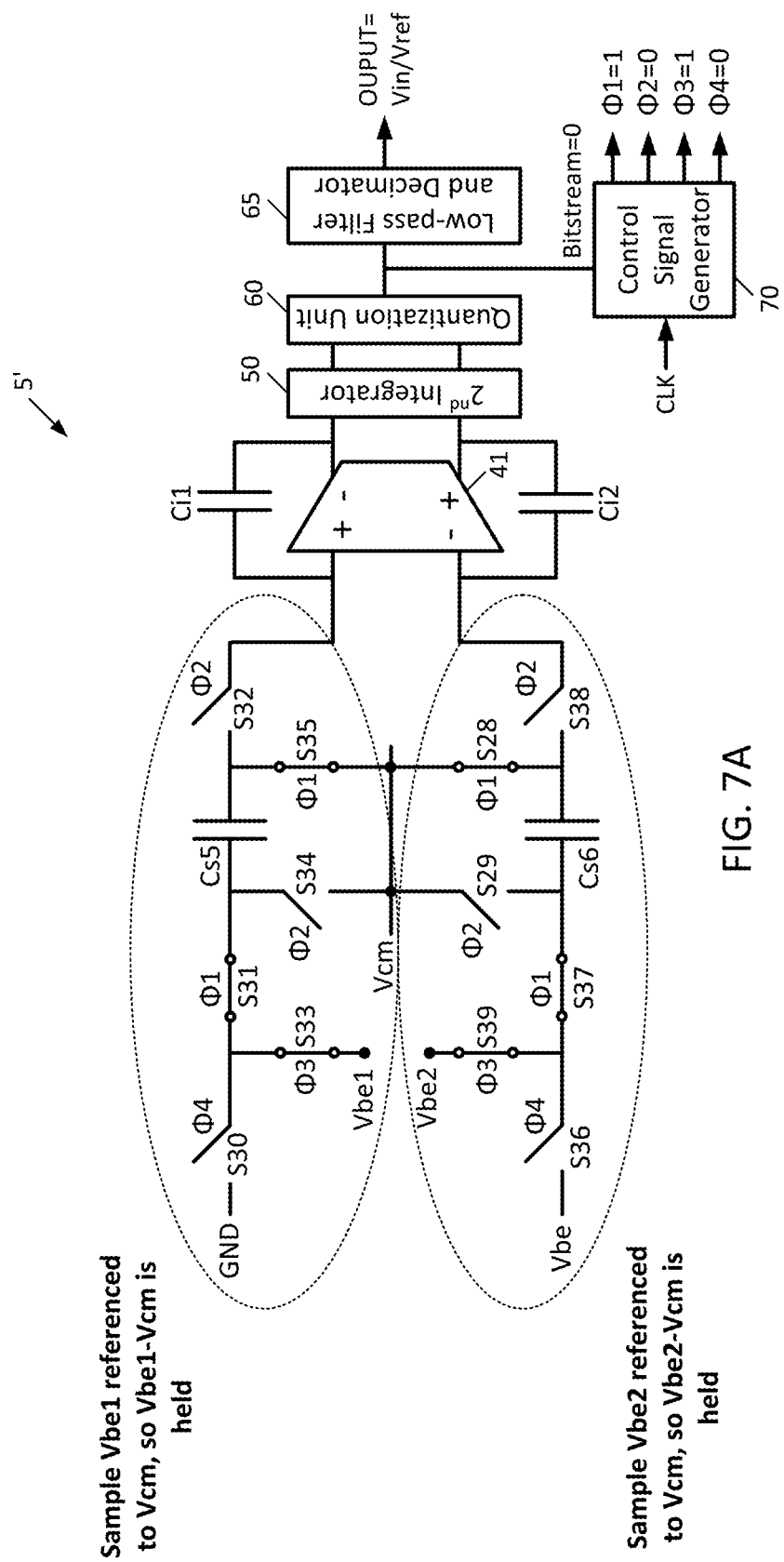
FIG. 7A shows the design of FIG. 6 operating in a sampling phase when the previously output bit of the generated bitstream was a logic 0.

This sampling phase is shown in FIG. 7A, where it can be seen that: switches S31, S33, and S35 close to sample Vbe1 referenced to the common mode voltage Vcm across the capacitor Cs5, thereby charging the capacitor Cs5 to the voltage Vbe1−Vcm; and switches S37, S39, and S28 close to sample Vbe2 referenced to the common mode voltage Vcm across the capacitor Cs6, thereby charging the capacitor Cs6 to the voltage Vbe2−Vcm.

Figure 7B:
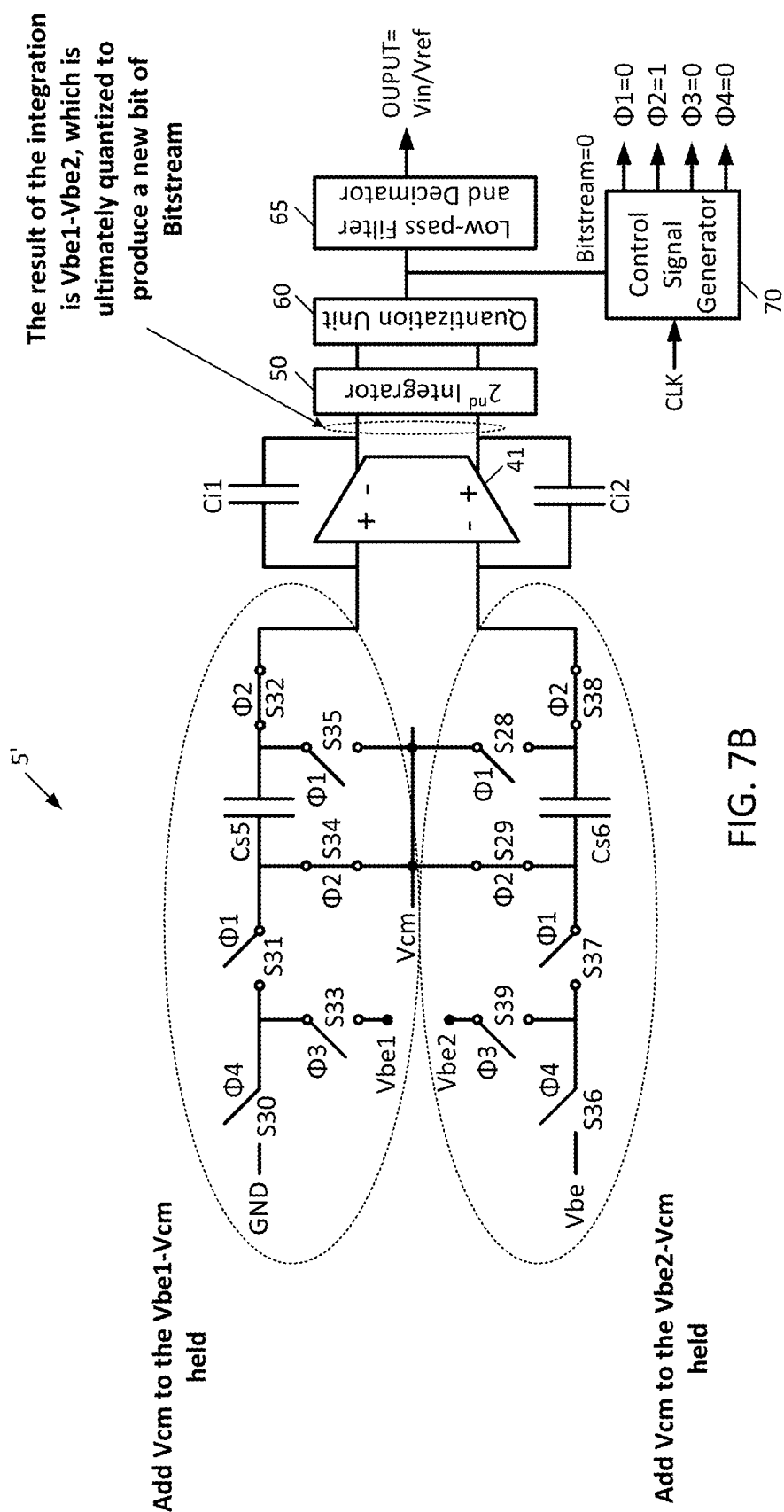
FIG. 7B shows the design of FIG. 6 operating in an integration phase when the previously output bit of the generated bitstream was a logic 0.

When the clock signal CLK then transitions to a logic low, the control signal generator 70 then causes the control signals Φ1 and Φ3 to transition to a logic low, causes the control signal Φ2 to transition to logic high, and maintains the control signal Φ4 logic low, thereby beginning an integration phase. This integration phase is shown in FIG. 7B, where it can be seen that: switches S32 and S34 close to add the voltage Vcm to the voltage Vbe1−Vcm stored across the capacitor Cs5, thereby applying Vbe1 to the non-inverting terminal of the integrator 41; and switches S38 and S29 close to add the voltage Vcm to the voltage Vbe2−Vcm stored across the capacitor C64, thereby applying Vbe2 to the inverting terminal of the integrator 41.

Summing the voltages applied to the non-inverting terminal of the integrator 41 yields the voltage Vbe1, while summing the voltages applied to the inverting terminal of the integrator 41 yields the voltage Vbe2. The result of the integration performed by the integrator 41 is therefore the voltage Vbe1−Vbe2, assuming the integrator 41 has a unity gain.

The sampling phase (FIG. 7A) and integration phase (FIG. 7B) are each repeated p times when Bitstream is at 0. Therefore, p(Vbe1−Vbe2) is ultimately integrated when the Bitstream is at 0, and the second integrator 50 performs a further integration of the voltage p(Vbe1−Vbe2), which is then quantized to generate a next bit of the Bitstream by the quantization circuit 60. This next bit of the Bitstream will be used by the control signal generator 70 to generate new values of control signals Φ1, Φ2, Φ3, and Φ4. In addition, the Bitstream is passed through circuit 65, which performs a low pass filtering and decimation to yield the output digital code (in which the ratio of 1s to 0s over a given window of time represents the desired output μ, which can be used to calculate the temperature of the chip into which the temperature sensor circuit 5 is integrated).

Figure 7C:
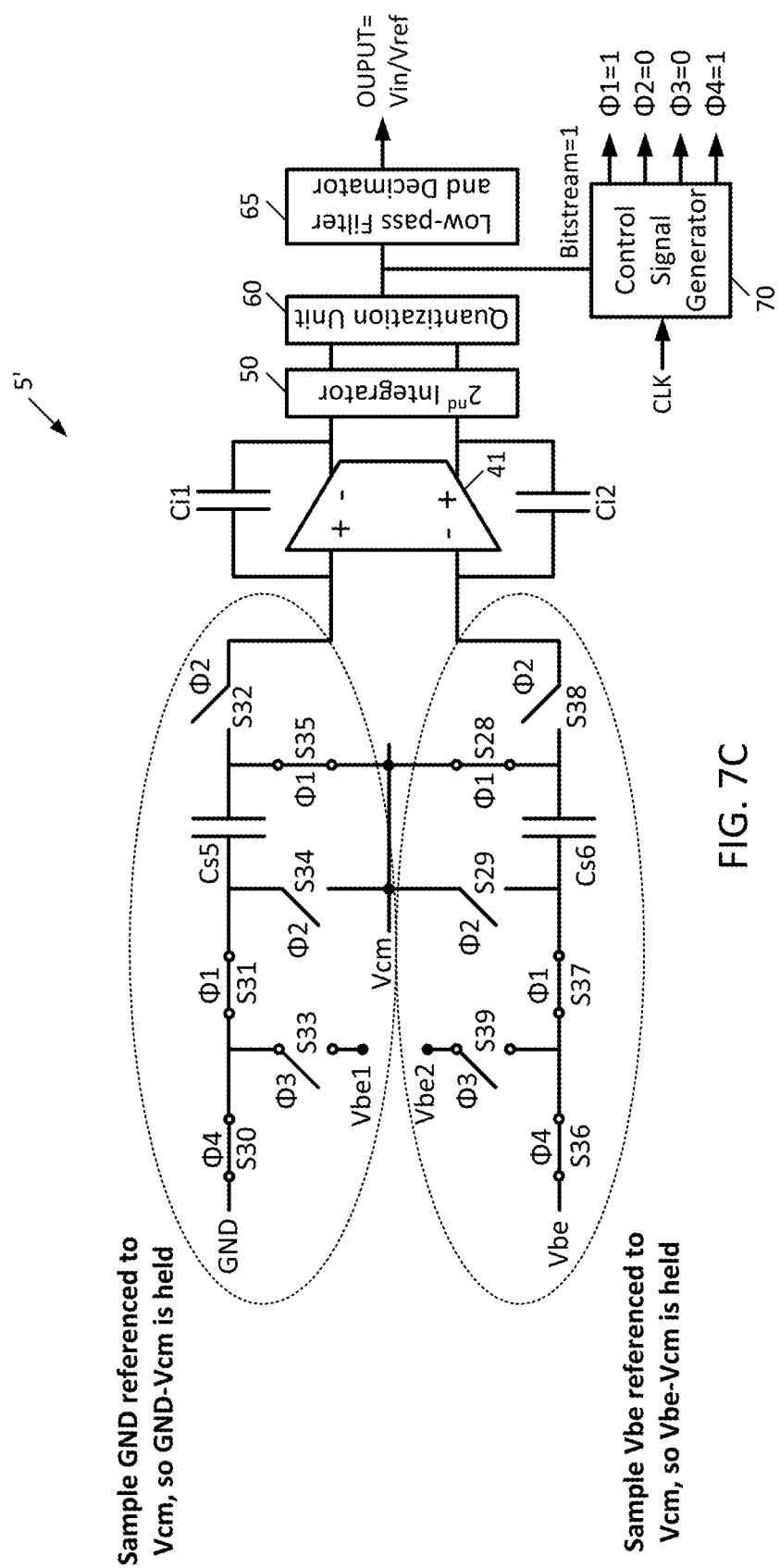
FIG. 7C shows the design of FIG. 6 operating in a sampling phase when the previously output bit of the generated bitstream was a logic 1.

Assume now that the next bit produced by the quantization circuit 60, at time t2, is a logical 1. In such a case, when the clock signal CLK transitions to logic high and the Bitstream is at a logic zero, the control signal generator 70 causes the control signals Φ1 and Φ4 to transition to logic high and stay logic high until the clock signal CLK transitions to a logic low, while maintaining the control signals Φ2 and Φ3 logic low, thereby beginning a sampling phase. This sampling phase is shown in FIG. 7C, where it can be seen that: switches S30, S31, and S35 close to sample ground referenced to the common mode voltage Vcm across the capacitor Cs5, thereby charging the capacitor Cs5 to the voltage GND−Vcm; and switches S36, S37, and S28 close to sample the voltage Vbe referenced to the common mode voltage Vcm across the capacitor Cs6, thereby charging the capacitor Cs6 to the voltage Vbe−Vcm.

Figure 7D:
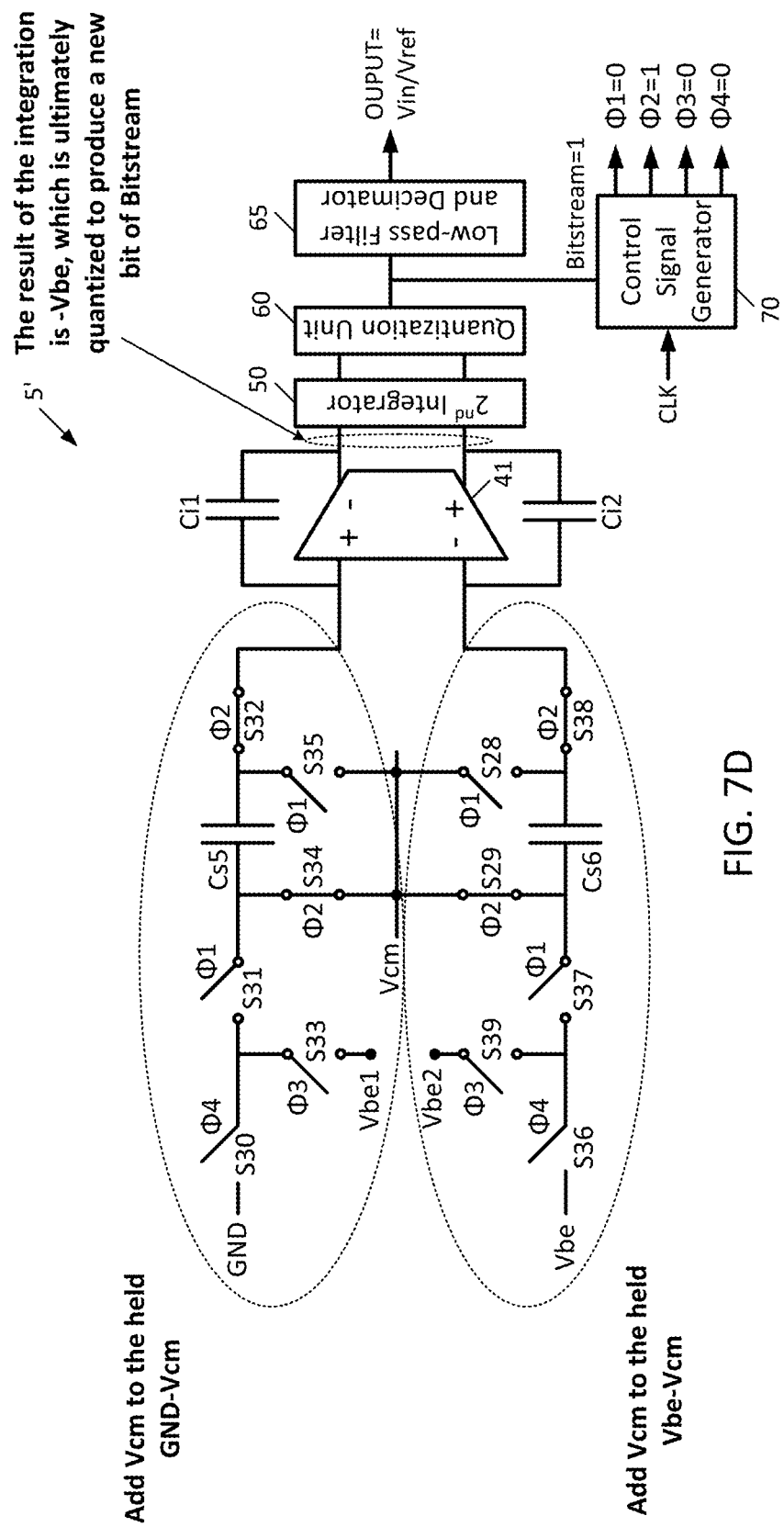
FIG. 7D shows the design of FIG. 6 operating in an integration phase when the previously output bit of the generated bitstream was a logic 1.

When the clock signal CLK then transitions to a logic low, the control signal generator 70 then causes the control signals Φ1 and Φ4 to transition to a logic low, causes the control signal Φ2 to transition to logic high, and maintains the control signal 13 logic low, thereby beginning an integration phase. This integration phase is shown in FIG. 7D, where it can be seen that: switches S32 and S34 close to add the voltage Vcm to the voltage GND−Vcm stored across the capacitor Cs5, thereby applying GND to the non-inverting terminal of the integrator 41; and switches S38 and S29 close to add the voltage Vcm to the voltage Vbe−Vcm stored across the capacitor Cs6, thereby applying Vbe to the inverting terminal of the integrator 41.

Summing the voltages applied to the non-inverting terminal of the integrator 41 yields the voltage GND, while summing the voltages applied to the inverting terminal of the integrator 41 yields the voltage Vbe. The result of the integration performed by the integrator 41 is therefore the voltage −Vbe, assuming the integrator 41 has a unity gain.

The sampling phase (FIG. 7C) and integration phase (FIG. 7D) are each repeated q times when Bitstream is at 0. Therefore, q(−Vbe) is ultimately integrated when the Bitstream is at 0, and the second integrator 50 performs a further integration of the voltage q(−Vbe), which is then quantized to generate a next bit of the Bitstream by the quantization circuit 60. This next bit of the Bitstream will be used by the control signal generator 70 to generate new values of control signals Φ1, Φ2, Φ3, and Φ4. In addition, the Bitstream is passed through circuit 65, which performs a low pass filtering and decimation to yield the output digital code (in which the ratio of 1s to 0s over a given window of time represents the desired output μ, which can be used to calculate the temperature of the chip into which the temperature sensor circuit 5 is integrated).

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:
1. A temperature sensing circuit, comprising:
voltage generation circuitry comprising:
first and second bipolar junction transistors having coupled collectors and bases, and biased at different current densities; and
a third bipolar junction transistor having its collector coupled to its base, the third bipolar junction transistor biased by a calibrated current;
an integrator;
a switched capacitor circuit configured to selectively sample voltages produced by the voltage generation circuitry and provide the sampled voltages to inputs of the integrator;
a quantization circuit configured to quantize outputs of the integrator to produce a bitstream;
wherein the switched capacitor circuit cooperates with the integrator under control of the bitstream to:
when a most recent bit of the bitstream is a logic zero, cause sampling and integration of a difference between a base-emitter voltage of the first bipolar junction transistor and a base-emitter voltage of the second bipolar junction transistor a first number of times to thereby produce a voltage proportional to absolute temperature; and
when the most recent bit of the bitstream is a logic one, cause sampling and integration of a base-emitter voltage of the third bipolar junction transistor a second number of times to thereby produce a voltage complementary to absolute temperature; and a low pass filter and decimator configured to filter and decimate the bitstream produced by the quantization circuit to produce a signal indicative of a temperature of a chip into which the temperature sensing circuit is placed.

2. The temperature sensing circuit of claim 1, wherein the switched capacitor circuit comprises:
a first capacitor used to sample and hold the base-emitter voltage of the first bipolar junction transistor; and
a second capacitor used to sample and hold the base-emitter voltage of the second bipolar junction transistor.

3. The temperature sensing circuit of claim 2, wherein the switched capacitor circuit further comprises:
a third capacitor used to sample and hold ground; and
a fourth capacitor used to sample and hold the base-emitter voltage of the third bipolar junction transistor.

4. The temperature sensing circuit of claim 3, wherein the switched capacitor circuit further comprises:
a first switch having a first node coupled to the base-emitter voltage of the first bipolar junction transistor, wherein the first switch operates in response to a third control signal;
a second switch having a first node coupled to a second node of the first switch and a second node coupled to a first node of the first capacitor, wherein the second switch operates in response to a first control signal;
a third switch having a first node coupled to a second node of the first capacitor and a second node coupled to a non-inverting input of the integrator, wherein the third switch operates in response to a second control signal;
a fourth switch having a first node coupled to the second node of the first switch and a second node coupled to a common mode voltage, wherein the fourth switch operates in response to a fourth control signal;
a fifth switch having a first node coupled to the first node of the first capacitor and a second node coupled to the common mode voltage, wherein the fifth switch operates in response to the second control signal; and
a sixth switch having a first node coupled to the second node of the first capacitor and a second node coupled to the common mode voltage, wherein the sixth switch operates in response to the first control signal.

5. The temperature sensing circuit of claim 4, wherein the switched capacitor circuit further comprises:
a seventh switch having a first node coupled to the base-emitter voltage of the second bipolar junction transistor, wherein the seventh switch operates in response to the third control signal;
an eighth switch having a first node coupled to a second node of the seventh switch and a second node coupled to a first node of the second capacitor, wherein the eighth switch operates in response to the first control signal;
a ninth switch having a first node coupled to a second node of the second capacitor and a second node coupled to an inverting input of the integrator, wherein the ninth switch operates in response to the second control signal;
a tenth switch having a first node coupled to the second node of the seventh switch and a second node coupled to the common mode voltage, wherein the tenth switch operates in response to the fourth control signal;
an eleventh switch having a first node coupled to the first node of the second capacitor and a second node coupled to the common mode voltage, wherein the eleventh switch operates in response to the second control signal; and
a twelfth switch having a first node coupled to the second node of the second capacitor and a second node coupled to the common mode voltage, wherein the twelfth switch operates in response to the first control signal.

6. The temperature sensing circuit of claim 5, wherein the switched capacitor circuit further comprises:
a thirteenth switch having a first node coupled to ground, wherein the thirteenth switch operates in response to the fourth control signal;
a fourteenth switch having a first node coupled to a second node of the thirteenth switch and a second node coupled to a first node of the third capacitor, wherein the fourteenth switch operates in response to the first control signal;
a fifteenth switch having a first node coupled to a second node of the third capacitor and a second node coupled to the non-inverting input of the integrator, wherein the fifteenth switch operates in response to the second control signal;
a sixteenth switch having a first node coupled to the second node of the thirteenth switch and a second node coupled to the common mode voltage, wherein the sixteenth switch operates in response to the third control signal;
a seventeenth switch having a first node coupled to the first node of the third capacitor and a second node coupled to the common mode voltage, wherein the seventeenth switch operates in response to the second control signal; and
an eighteenth switch having a first node coupled to the second node of the third capacitor and a second node coupled to the common mode voltage, wherein the eighteenth switch operates in response to the first control signal.

7. The temperature sensing circuit of claim 6, wherein the switched capacitor circuit further comprises:
a nineteenth switch having a first node coupled to the base-emitter voltage of the third bipolar junction transistor, wherein the nineteenth switch operates in response to the fourth control signal;
a twentieth switch having a first node coupled to a second node of the nineteenth switch and a second node coupled to a first node of the fourth capacitor, wherein the twentieth switch operates in response to the first control signal;
a twenty first switch having a first node coupled to a second node of the fourth capacitor and a second node coupled to the inverting input of the integrator, wherein the twenty first switch operates in response to the second control signal;
a twenty second switch having a first node coupled to the second node of the nineteenth switch and a second node coupled to the common mode voltage, wherein the twenty second switch operates in response to the third control signal;
a twenty third switch having a first node coupled to the first node of the second capacitor and a second node coupled to the common mode voltage, wherein the twenty third switch operates in response to the second control signal; and
a twenty fourth switch having a first node coupled to the second node of the second capacitor and a second node coupled to the common mode voltage, wherein the twenty fourth switch operates in response to the first control signal.

8. The temperature sensing circuit of claim 7, further comprising a control signal generator configured to, when the most recent bit of the bitstream is a logic zero:
in a sampling phase, assert the first control signal and third control signal, while deasserting the second and fourth control signals; and
in an integration phase, assert the second control signal while deasserting the first, third, and fourth control signals.

9. The temperature sensing circuit of claim 8, wherein the control signal generator is further configured to, when the most recent bit of the bitstream is a logic one:
in a sampling phase, assert the first control signal and the fourth control signal, while deasserting the second and third control signals; and
in an integration phase, assert the second control signal, while deasserting the first, third, and fourth control signals.

10. The temperature sensing circuit of claim 3, wherein the switched capacitor circuit further comprises:
a first switch circuit configured to selectively connect the first capacitor between the base-emitter voltage of the first bipolar junction transistor and a non-inverting input of the integrator, when the most recent bit of the bitstream is a logic zero and the switched capacitor circuit is cooperating with the integrator to perform sampling;
wherein the first switch circuit selectively connects the first capacitor between a common mode voltage and the non-inverting input of the integrator, when the most recent bit of the bitstream is a logic zero and the switched capacitor circuit is cooperating with the integrator to perform integration;
a second switch circuit configured to selectively connect the second capacitor between the base-emitter voltage of the second bipolar junction transistor and an inverting input of the integrator, when the most recent bit of the bitstream is a logic zero and the switched capacitor circuit is cooperating with the integrator to perform sampling;
wherein the second switch circuit selectively connects the second capacitor between the common mode voltage and the inverting input of the integrator, when the most recent bit of the bitstream is a logic zero and the switched capacitor circuit is cooperating with the integrator to perform integration;
a third switch circuit configured to selectively connect the third capacitor between ground and the non-inverting input of the integrator, when the most recent bit of the bitstream is a logic one and the switched capacitor circuit is cooperating with the integrator to perform sampling;
wherein the third switch circuit selectively connects the third capacitor between the common mode voltage and the non-inverting input of the integrator, when the most recent bit of the bitstream is a logic one and the switched capacitor circuit is cooperating with the integrator to perform integration;
a fourth switch circuit configured to selectively connect the fourth capacitor between the base-emitter voltage of the third bipolar junction transistor and the inverting input of the integrator, when the most recent bit of the bitstream is a logic one and the switched capacitor circuit is cooperating with the integrator to perform sampling; and
wherein the fourth switch circuit selectively connects the fourth capacitor between the common mode voltage and the inverting input of the integrator, when the most recent bit of the bitstream is a logic one and the switched capacitor circuit is cooperating with the integrator to perform integration.

11. The temperature sensing circuit of claim 2, wherein the switched capacitor circuit further comprises:
a first switch circuit configured to selectively connect the first capacitor between the base-emitter voltage of the first bipolar junction transistor and a non-inverting input of the integrator, when the most recent bit of the bitstream is a logic zero and the switched capacitor circuit is cooperating with the integrator to perform sampling;
wherein the first switch circuit selectively connects the first capacitor between a common mode voltage and the non-inverting input of the integrator, when the most recent bit of the bitstream is a logic zero and the switched capacitor circuit is cooperating with the integrator to perform integration;
wherein the first switch circuit selectively connects the first capacitor between ground and the non-inverting input of the integrator, when the most recent bit of the bitstream is a logic one and the switched capacitor circuit is cooperating with the integrator to perform sampling;
wherein the first switch circuit selectively connects the first capacitor between the common mode voltage and the non-inverting input of the integrator, when the most recent bit of the bitstream is a logic one and the switched capacitor circuit is cooperating with the integrator to perform integration;
a second switch circuit configured to selectively connects the second capacitor between the base-emitter voltage of the second bipolar junction transistor and an inverting input of the integrator, when the most recent bit of the bitstream is a logic zero and the switched capacitor circuit is cooperating with the integrator to perform sampling;
wherein the second switch circuit selectively connects the second capacitor between the common mode voltage and the inverting input of the integrator, when the most recent bit of the bitstream is a logic zero and the switched capacitor circuit is cooperating with the integrator to perform integration;
wherein the second switch circuit selectively connects the second capacitor between the base-emitter voltage of the third bipolar junction transistor and the inverting input of the integrator, when the most recent bit of the bitstream is a logic one and the switched capacitor circuit is cooperating with the integrator to perform sampling; and
wherein the second switch circuit selectively connects the second capacitor between the common mode voltage and the inverting input of the integrator, when the most recent bit of the bitstream is a logic one and the switched capacitor circuit is cooperating with the integrator to perform integration.

12. The temperature sensing circuit of claim 2, wherein the switched capacitor circuit further comprises:
a thirtieth switch having a first node coupled to ground, wherein the thirtieth switch operates in response to a fourth control signal;

a thirty first switch having a first node coupled to a second node of the thirtieth switch and a second node coupled to a first node of the first capacitor, wherein the thirty first switch operates in response to a first control signal;

a thirty second switch having a first node coupled to a second node of the first capacitor and a second node coupled to a non-inverting input of the integrator, wherein the thirty second switch operates in response to a second control signal;

a thirty third switch having a first node coupled to the base-emitter voltage of the first bipolar junction transistor and a second node coupled to the second node of the thirtieth switch, wherein the thirty third switch operates in response to a third control signal;

a thirty fourth switch having a first node coupled to the second node of the thirty first switch and a second node coupled to a common mode voltage, wherein the thirty fourth switch operates in response to a second control signal;

a thirty fifth switch having a first node coupled to the second node of the first capacitor and a second node coupled to the common mode voltage, wherein the thirty fifth switch operates in response to the first control signal;

a thirty sixth switch having a first node coupled to the base-emitter voltage of the third bipolar junction transistor, wherein the thirty sixth switch operates in response to the fourth control signal;

a thirty seventh switch having a first node coupled to a second node of the thirty sixth switch and a second node coupled to a first node of the second capacitor, wherein the thirty seventh switch operates in response to a first control signal;

a thirty eighth switch having a first node coupled to a second node of the second capacitor and a second node coupled to an inverting input of the integrator, wherein the thirty eighth switch operates in response to a second control signal;

a thirty ninth switch having a first node coupled to the base-emitter voltage of the second bipolar junction transistor and a second node coupled to the second node of the thirty sixth switch, wherein the thirty ninth switch operates in response to a third control signal;

a twenty ninth switch having a first node coupled to the second node of the thirty seventh switch and a second node coupled to a common mode voltage, wherein the twenty ninth switch operates in response to a second control signal; and a twenty eighth switch having a first node coupled to the second node of the second capacitor and a second node coupled to the common mode voltage, wherein the twenty eighth switch operates in response to the first control signal.

13. The temperature sensing circuit of claim 1, wherein the first number of times is an integer greater than 1; and wherein the second number of times is one time.

14. The temperature sensing circuit of claim 1, wherein the first number of times is a first integer greater than 1; and wherein the second number of times is a second integer greater than 1.

15. The temperature sensing circuit of claim 11, wherein the second number of times is less than the first number of times.

16. A sensing circuit, comprising:
voltage generation circuitry comprising:
first and second bipolar junction transistors having coupled collectors and bases, and biased at different current densities; and
a third bipolar junction transistor having its collector coupled to its base, the third bipolar junction transistor biased by a calibrated current and having a base-emitter voltage that is a voltage complementary to absolute temperature;

an integrator;

a switched capacitor circuit configured to selectively sample voltages produced by the voltage generation circuitry and provide the sampled voltages to inputs of the integrator;

a quantization circuit configured to quantize outputs of the integrator to produce a bitstream;

wherein the switched capacitor circuit cooperates with the integrator under control of the bitstream to:
when a most recent bit of the bitstream is a first logic value, cause sampling and integration of a difference between a base-emitter voltage of the first bipolar junction transistor and a base-emitter voltage of the second bipolar junction transistor a first number of times; and
when the most recent bit of the bitstream is a second logic value, cause sampling and integration of a base-emitter voltage of the third bipolar junction transistor a second given number of times; and
output circuitry configured to produce an output signal by performing an operation on the bitstream.

17. The sensing circuit of claim 16, wherein the first number of times is an integer greater than 1; and wherein the second number of times is one time.

18. The sensing circuit of claim 16, wherein the first number of times is a first integer greater than 1; and wherein the second number of times is a second integer greater than 1.

19. The sensing circuit of claim 18, wherein the second number of times is less than the first number of times.

20. The sensing circuit of claim 16, wherein the switched capacitor circuit comprises:
a first capacitor used to sample and hold the base-emitter voltage of the first bipolar junction transistor;
a second capacitor used to sample and hold the base-emitter voltage of the second bipolar junction transistor;
a first switch circuit configured to selectively connect the first capacitor between the base-emitter voltage of the first bipolar junction transistor and a non-inverting input of the integrator, when the most recent bit of the bitstream is the first logic value and the switched capacitor circuit is cooperating with the integrator to perform sampling;
wherein the first switch circuit selectively connects the first capacitor between a common mode voltage and the non-inverting input of the integrator, when the most recent bit of the bitstream is the first logic value and the switched capacitor circuit is cooperating with the integrator to perform integration; and
a second switch circuit configured to selectively connects the second capacitor between the base-emitter voltage of the second bipolar junction transistor and an inverting input of the integrator, when the most recent bit of the bitstream is the first logic value and the switched capacitor circuit is cooperating with the integrator to perform sampling;
wherein the second switch circuit selectively connects the second capacitor between the common mode voltage and the inverting input of the integrator, when the most recent bit of the bitstream is the first logic value and the switched capacitor circuit is cooperating with the integrator to perform integration.

21. The sensing circuit of claim 16, wherein the switched capacitor circuit comprises:
- a first capacitor used to sample and hold the base-emitter voltage of the first bipolar junction transistor;
- a second capacitor used to sample and hold the base-emitter voltage of the second bipolar junction transistor;
- a first switch circuit configured to selectively connect the first capacitor between ground and a non-inverting input of the integrator, when the most recent bit of the bitstream is the second logic value and the switched capacitor circuit is cooperating with the integrator to perform sampling;

wherein the first switch circuit selectively connects the first capacitor between the common mode voltage and the non-inverting input of the integrator, when the most recent bit of the bitstream is the second logic value and the switched capacitor circuit is cooperating with the integrator to perform integration; and a second switch circuit configured to selectively connect the second capacitor between the base-emitter voltage of the third bipolar junction transistor and an inverting input of the integrator, when the most recent bit of the bitstream is the second logic value and the switched capacitor circuit is cooperating with the integrator to perform sampling;

wherein the second switch circuit selectively connects the second capacitor between the common mode voltage and the inverting input of the integrator, when the most recent bit of the bitstream is the second logic value and the switched capacitor circuit is cooperating with the integrator to perform integration.

* * * * *